United States Patent [19]

MacGregor et al.

[11] Patent Number: 4,887,203

[45] Date of Patent: Dec. 12, 1989

[54] MICROCODED PROCESSOR EXECUTING MICROROUTINES WITH A USER SPECIFIED STARTING MICROADDRESS

[75] Inventors: Douglas B. MacGregor; William C. Moyer, both of Austin, Tex.; John E. Zolnowsky, Menlo Park, Calif.; David S. Mothersole, Austin, Tex.

[73] Assignee: Motorola, Inc., Schaumburg, Ill.

[21] Appl. No.: 165,409

[22] Filed: Feb. 26, 1988

Related U.S. Application Data

[63] Continuation of Ser. No. 660,587, Oct. 15, 1984, abandoned.

[51] Int. Cl.[4] .......................... G06F 9/22; G06F 9/26; G06F 9/40
[52] U.S. Cl. .................................................. 364/200
[58] Field of Search ... 364/200 MS File, 900 MS File

[56] References Cited

U.S. PATENT DOCUMENTS

| | | | |
|---|---|---|---|
| 4,034,194 | 7/1977 | Thomas | 371/18 |
| 4,038,643 | 7/1977 | Kim | 364/200 |
| 4,042,972 | 8/1977 | Gruner et al. | 364/200 |
| 4,339,819 | 7/1982 | Jacobson | 364/200 |
| 4,342,078 | 7/1982 | Tredennick et al. | 364/200 |
| 4,415,969 | 11/1983 | Bayliss | 364/200 |
| 4,433,413 | 2/1984 | Fasang | 364/900 |
| 4,461,000 | 7/1984 | Young | 371/21 |
| 4,482,953 | 11/1984 | Burke | 364/200 |
| 4,488,228 | 12/1984 | Crudele et al. | 364/200 |
| 4,679,138 | 7/1987 | Epstein et al. | 364/200 |

*Primary Examiner*—Archie E. Williams, Jr.
*Assistant Examiner*—Emily Y. Chan
*Attorney, Agent, or Firm*—Robert L. King

[57] ABSTRACT

In a microcoded data processor, an instruction is provided which enables the microaddress for the micromachine to be externally specified. By way of this instruction, the processor may be directed to execute special microcoded routines otherwise unavailable during normal execution. These special microcoded routines may perform useful functions such as testing in an expeditious manner portions of the circuitry of the processor which would otherwise be difficult to test. For example, the functionality of regular structures such as instruction decoding and control programmable logic arrays (PLA's) may either be gated directly out to the tester or internally analyzed before the accumulated results are presented to the tester. On-board instruction caches may also be efficiently exercised to verify that the tag portion properly determines "hits" and "misses", and that the actual instruction cache portion functions accurately.

3 Claims, 4 Drawing Sheets

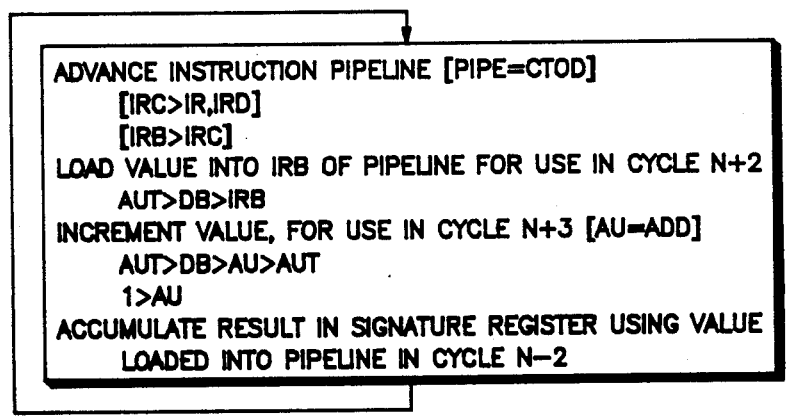
FIG. 2
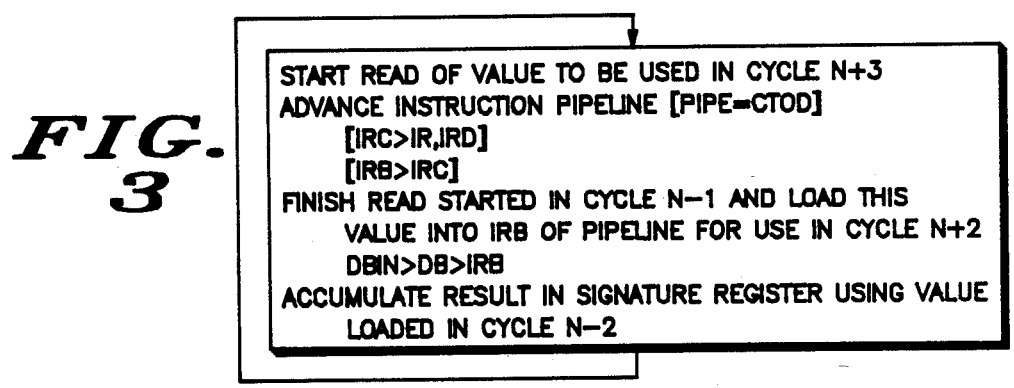
FIG. 3
FIG. 5
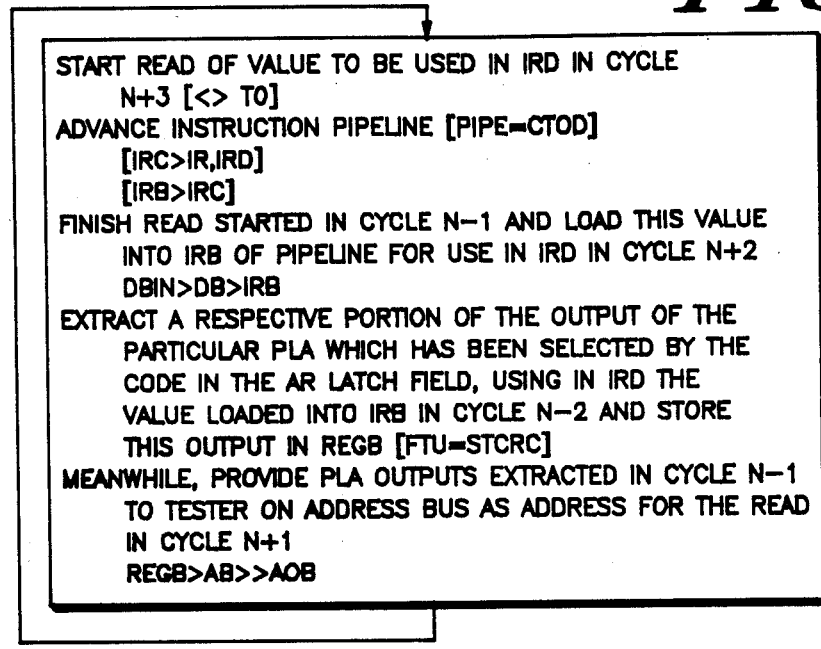

MICROCODED PROCESSOR EXECUTING MICROROUTINES WITH A USER SPECIFIED STARTING MICROADDRESS This is a continuation of application Ser. No. 660,587, filed Oct. 15, 1984, now abandoned.

CROSS REFERENCE TO RELATED APPLICATIONS

Related subject matter is disclosed in the following applications filed simultaneously herewith and assigned to the Assignee hereof:

1. U.S. patent application No. 4,744,049, entitled MICROCODE TESTING OF A CACHE IN A DATA PROCESSOR, inventors John Kuban, Douglas B. MacGregor, Robert R. Thompson and David S. Mothersole.

2. U.S. patent application No. 4,745,574, entitled MICROCODE TESTING OF PLA'S IN A DATA PROCESSOR, inventors Robert W. Aaron, John Kuban, Douglas B. MacGregor and Robert R. Thompson.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to testing of a data processor to determine functionality, and, more particularly, to the testing of a microcoded data processor.

BACKGROUND OF THE INVENTION

In microcoded data processors, each macroinstruction is typically decoded to develop the microaddress of the first microinstruction in the particular sequence of microinstructions appropriate for executing that instruction. Once microinstruction execution begins, control of the next microaddress is carefully maintained by each subsequent microinstruction in the microsequence. For example, each microinstruction may explicitly define the next microaddress. Alternatively, the microinstruction may simply enable another component to provide the next microaddress. In some processors, the microinstruction may enable branch control logic to develop the microaddress based upon the results of some operation in the arithmetic and logic unit (ALU) or other logic. While some processors allow the user to construct microinstructions so as to selectively employ one or more optional microsequences, no known processor allows the user to directly specify the microaddress used to access the microcode.

SUMMARY OF THE INVENTION

It is an object of the present invention to provide a microcoded data processor wherein the microaddress can be directly specified by the user.

Another object of the present invention is to provide a method for directly specifying the microaddress of a microcoded data processor.

Still another object of the present invention is to provide special microsequences in a microcoded data processor which can only be directly addressed.

In carrying out these and other objects of the present invention, there is provided, in one form, a data processor having a micromachne which controls the execution by the processor of each of a plurality of instructions by executing respective microroutines having a predetermined starting microaddress. In particular, the processor includes one instruction, which, when executed by the processor, selectively provides the next microaddress for the micromachine. In accordance with the present invention, the processor includes a special microcoded routine in the processor having a special starting microaddress different from the starting microaddresses of all other microroutines. Since the micromachine cannot itself generate the special starting microaddress, the special microcoded routine may be executed by the micromachine only in response to the execution by the processor of the one instruction to provide the special starting microaddress of the special microcoded routine.

BRIEF DESCRIPTION OF THE DRAWINGS

FIG. 2 is a flow diagram of one microcoded test routine for testing a first portion of the instruction decoding circuitry of the processor of FIG. 1.

FIG. 3 is a flow diagram of another microcoded test routine for testing the first portion of the instruction decoding circuitry of the processor of FIG. 1.

FIG. 5 is a flow diagram of a set of microcoded test routines for testing a third portion of the instruction decoding circuitry of the processor of FIG. 1.

DESCRIPTION OF THE INVENTION

Figure 1:
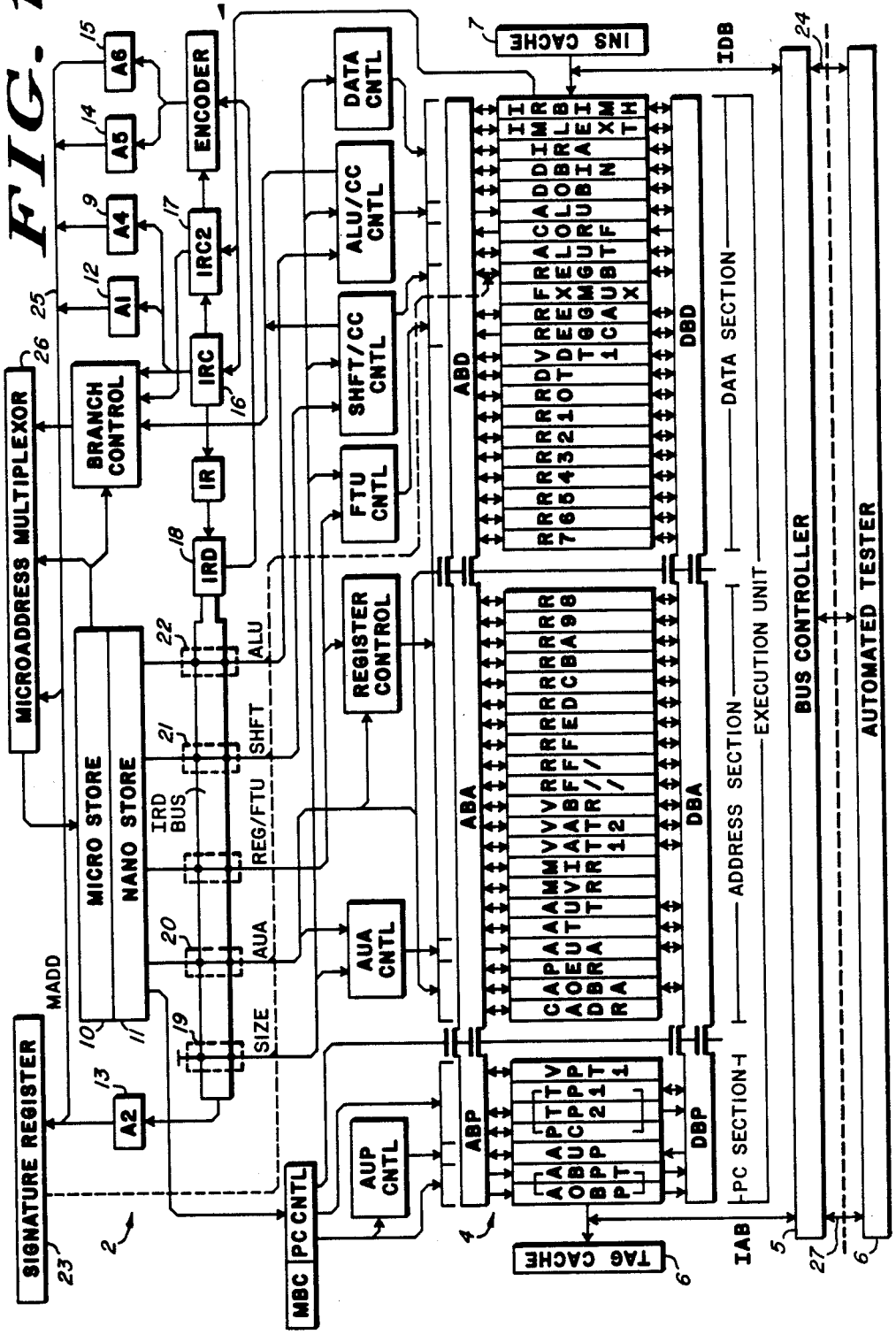
FIG. 1 is a block diagram of a microcoded data processor adapted to practice the present invention.

Shown in FIG. 1 is a microcoded data processor 1 similar to that shown and described in U.S. Pat. No. 4,488,228, entitled "Virtual Memory Data Processor". In general, the processor 1 includes a micromachine 2 responsible for accomplishing the execution of instructions received via an instruction pipeline 3, using a segmented execution unit 4. A bus controller 5 cooperates with the micromachine 2 in transfering the instructions and any necessary data operands between the processor 1 and external resources such as an automated tester 6. To reduce bus bandwidth requirements and to increase execution speed, processor 1 includes an instruction cache 7 which cooperates with a set associative tag cache 8 to provide a local store for recently used instructions or portions thereof.

Since most of the details of the construction and operation of the processor 1 are beyond the scope of the present invention, only relevant portions will be described herein. However, a more complete description of the bus controller 5 may be found in copending U.S. application Ser. Nos. 624,660, now allowed, Patent Nos. 4,633,437 and 655,105, now abandoned. A description of the instruction pipeline 3 may be found in copending U.S. application Ser. No. 625,066, now abandoned. The automated tester 6 may be any of a number of commercially available units such as the GenRad Model GR16.

As described in U.S. Pat. No. 4,488,228, the processor 1 is adapted to respond to certain types of error conditions by stacking off a block of information relating to its internal state before vectoring to an appropriate error handler. Typically, after the cause of the error has been corrected, the error handler executes a special "ReTurn from Exeception" (RTE) instruction which restores the state using the stacked information and then allows the processor 1 to resume execution from the precise point in the instruction execution sequence at which the error was detected.

For the purposes of the present invention, the most important item of information which is stored on the stack is the current value of the microaddress counter (MICRO PC). During the restore operation, this value is loaded into the A4 latch 9 and then used by the micromachine 2 to select for execution the next microinstruction in micro store 10 and nano store 11. During normal execution, if the value which is restored is not the same as the value which was stored, the processor 1 will be unable to properly resume execution of the faulted instruction. Thus, the user must take particular care in assuring that this portion of the stacked information is unchanged during the error handling procedure. On the other hand, as explained in U.S. Pat. No. 4,524,415, certain portions of the stacked information may be precisely changed so that the processor 1 will resume execution of the faulted instruction in an alternative manner. In general, except for such predefined changes, no other changes may be made in the stacked information without affecting the operation of the processor 1 in an undefined manner.

In the course of designing the processor U.S. Pat. Nos. 4,488,228, 4,524,415 and 4,493,035, it is realized that the processor described therein possessed the inherent ability to restore itself such that it would resume execution with any of the plurality of microinstructions. However, due to restrictions on the size of the micro store 10 and the nano store 11, this capability was never utilized to perform a useful function. When the processor 1 was thereafter taken up to design, it soon became evident that the enhanced functionality very significantly increased the testability problem. Although most of this increased power could be tested in a cost effective manner using conventional test procedures or special purpose test logic, certain areas of the circuitry of the processor 1 were particularly difficult or expensive to test with such techniques. It was therefore preposed that special microinstruction sequences be provided in the micro store 10 and nano store 11 to exercise dedicated test logic incorporated elsewhere in the processor 1. In this manner, not only where there significant reductions in the size of such test logic, but also in the time required to test the respective areas of circuitry in the processor 1.

Upon carefully examining the internal architecture and circuit arrangement within the processor 1, it was discovered that only a relatively few of the major circuit components where amenable to testing using microcoded test routines: the primary sequencing "Programmable Logic Arrays" (PLA's) A1 12, A2 13, A5 14 and A6 15 which decode the contents of the IRC 16, IRC2 17 and IRD 18 comprising the instruction pipeline 3; the residual control decode PLA's 19, 20, 21 and 22 (typical of a total of eight, all of which are not shown for convenience) which decode the current instruction in IRD 18; and the instruction and tag caches 7 and 8, respectively. Other areas of the processor 1 proved to be more efficiently tested either functionally using macroinstruction sequences, or explicitly using relatively conventional test circuitry such as an on-board signature analysis register 23. At the same time, the presence of the signature analysis register 23 makes it all the more efficient to test using microcoded test routines.

In preparation for testing the primary sequencing PLA's 12-15, the tester 6 must prepare a stack frame having all of the information necessary for the processor 1 to restore a valid state, in the format illustrated in Appendix I hereto. In the MICRO PC field, the tester 6 will insert the address within the micro store 10 and nano store 11 of one of the three (3) microinstructions shown in Appendix II hereto. In addition, the tester 6 must insert into the AR LATCH portion of the SSWI field, a code which indicates an appropriate one of the several primary sequencing PLA's 12-15 to be tested. The tester 6 should also insert a suitable initial starting value, say zero (0), for the particular PLA test into the [AUT.H:AUT.L] field. Similarly, other suitable values should be inserted into the IRD, IR, IRC and IRC2 fields so that the line will be initialized properly. If appropriate for the selected test routine, as explained below, the tester 6 must also set the CRC field in the SSWI to enable the signature register 23. Thereafter, at the appropriate point in a testing sequence, the tester 6 then provides an RTE instruction in the instruction stream of the processor 1 via the data bus 24.

If, for example, the tester 6 chooses to insert into the stack frame the address of the first microinstruction shown in Appendix II, the processor 1, upon executing the RTE instruction, will proceed as illustrated by flow diagram 90 in FIG. 2 by advancing the pipeline 3 before loading the specified initial value into the instruction pipe 3. Depending upon the AR LATCH code, either PLA A1 12 or A2 13 will provide a "microaddress" to the signature register 23 on the Microaddress ADDress (MADD) bus 25. Ignoring this microaddress, the micromachine 2 instead branches directly back to the current microinstruction using a direct branch path through the microaddress multiplexor 26. In this manner, the processor 1 will continue looping on this one microinstruction, incrementing each time the value which is loaded into the instruction pipeline 3. After a suitable number of cycles, the tester 6 can terminate the looping by resetting the processor 1. Coming out of reset, the processor 1 automatically transfers the residue in the signature register 23 into REGB in the data section of the execution unit 4 and then into AUT in the address section of the execution unit 4. The tester 6 may obtain this residue by simply forcing a bus error on the first bus cycle after reset so that the processor 1 will stack off all of the internal state information, including AUT. Using this microinstruction, the tester 6 can very rapidly verify exhaustively the functionality of each of the primary sequencing PLA's A1 12 through A4 15.

If, on the other hand, the tester 6 chooses to insert into the stack frame the address of the second microinstruction shown in Appendix II into the MICRO PC field, the processor 1 will proceed as illustrated by flow diagram 91 in FIG. 3 by advancing the pipeline 3 before loading into the instruction plate 3 a value which is provided by the tester 6 via the data bus 24. Again, depending upon the AR LATCH code, either PLA A1 12 or A2 13 will provide a "microaddress" to the signature register 23 on the MADD bus 25. Ignoring this microaddress, the micromachine 2 will instead branch directly to the current microinstruction using the direct branch path through the microaddress multiplexor 26. In this manner, the processor 1 will continue looping on this microinstruction, accepting each time the value which is to be loaded into the instruction pipeline 3. After a suitable number of cycles, the tester 6 can terminate the looping by resetting the processor 1 and then force the bus error so that the processor 1 will stack off the residue. Thus, by using this microinstruction, the tester 6 can selectively verify the functionality of the primary sequencing PLA's A1 12 and A2 13.

Figure 4:
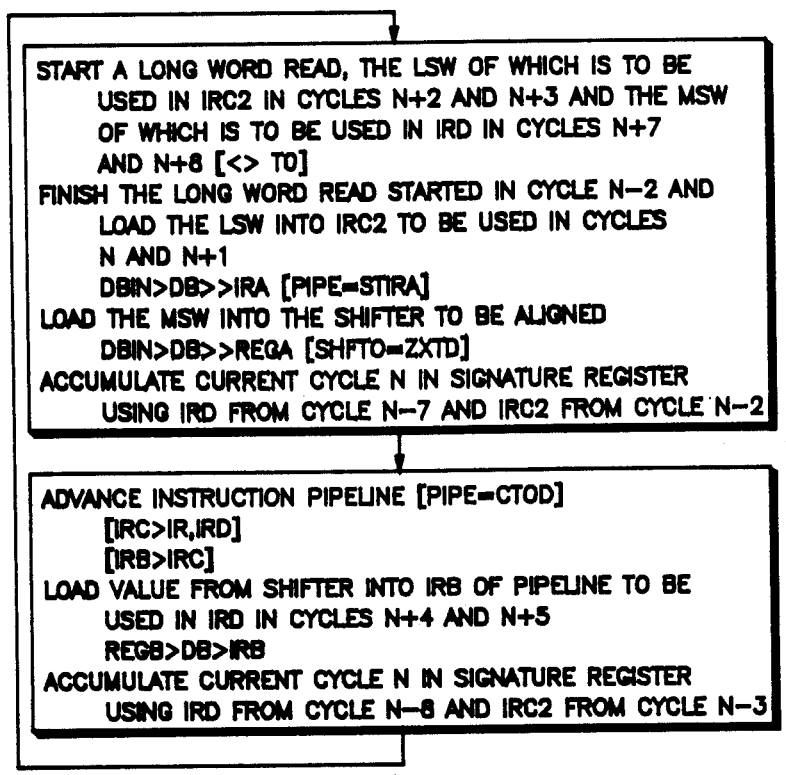
FIG. 4 is a flow diagram of a microcoded test routine for testing a second portion of the instruction decoding circuitry of the processor of FIG. 1.

If, instead, the tester 6 chooses to insert into the stack frame the address of the third microinstruction sequence shown in Appendix II into the MICRO PC field, the processor 1 will proceed as illustrated by flow diagram 92 in FIG. 4 to accept from the tester 6 via the data bus 24 a specific pair of values to be loaded into IRC2 17 and IRD 18 in the instruction pipeline 3. In the first microinstruction in this sequence, the processor 1 will load the new IRC2 value directly into IRC2 17, and enable the shifter FXMUX in the data section of the execution unit 4 to realign the new IRD value. In the next microinstruction in this sequence, the processor 1 will load the new IRD value into the pipeline 3. During the execution of each microinstruction, the "microaddress" provided by the selected PLA A5 14 or A6 15 is accumulated by the signature register 23. Since the new IRC2 and IRD values are loaded every other microinstruction cycle in a staggered sequence, the effect of each on the selected PLA is accumulated twice by the signature register 23. After allowing the processor 1 to continue repeating this sequence of two microinstructions for an appropriate number of microinstruction cycles, the tester 6 can reset the processor 1 and obtain the residue in the signature register 23. Using this short sequence of microinstructions, the tester 6 can selectively verify the functionality of the primary sequencing PLAs A5 14 and A6 15.

In preparation for testing the residual control PLA's 19–22, the tester 6 must also prepare a stack frame having all of the information necessary for the processor 1 to restore a valid state, in the format illustrated in Appendix I hereto. In the MICRO PC field, the tester 6 may insert the address within the micro store 10 and nano store 11 of one of the seven (7) microinstructions shown in Appendix III hereto. In addition, the tester 6 must insert into the AR Latch portion of the SSWI field, a code which indicates which portion of the several residual control PLA's 19–22 is to be tested. Thereafter, at the appropriate point in the testing sequence, the testing 6 then provides the RTE instruction in the instruction stream of the processor 1 via the data bus 24.

Figure 6:
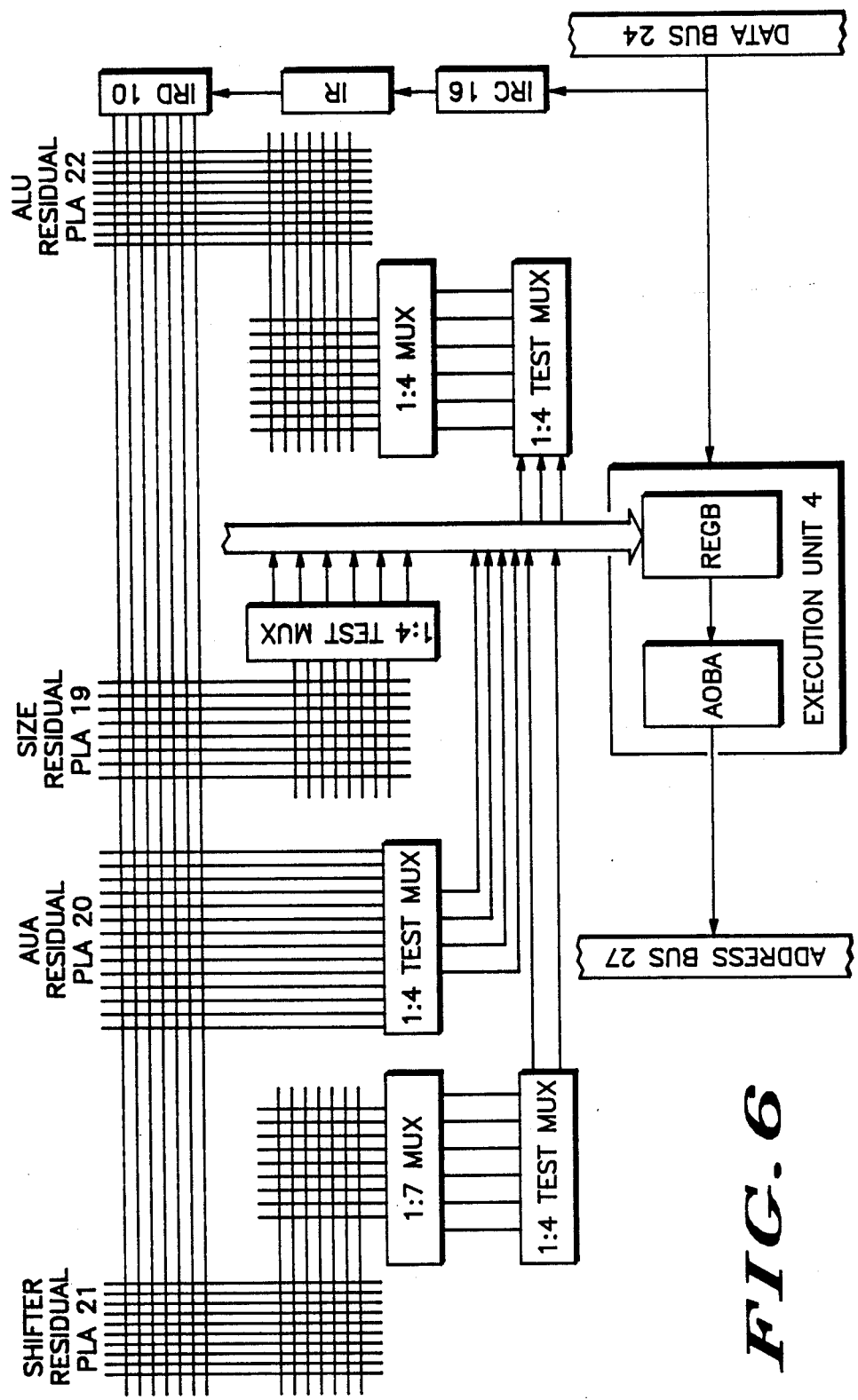
FIG. 6 is a schematic diagram illustrating special test circuitry for providing multiplexed access to the numerous control signals produced by the third portion of the instruction decoding circuitry of the process of FIG. 1 during the execution of the microcoded test routines of FIG. 5.

Regardless of which address the tester 6 chooses to insert into the MICRO PC field in the stack frame from among those of the microinstructions shown in Appendix III, the processor 1 will proceed as illustrated by flow diagram 93 in FIG. 5 to read from the tester 6 via the data bus 24 a specific value to be loaded into the instruction pipeline 3. The processor 1 will then extract via special 7-way multiplexing circuitry, such as that shown by way of illustration in FIG. 6, the selected portion of the resulting outputs of the several PLAs 19–22 and store these outputs in REGB in the data section of the execution unit 4. Simultaneously, the processor 1 will provide the outputs stored during the last execution of this microinstruction to the tester 6 via the address bus 27 just as if these outputs constituted the "address" for the next read bus cycle. Therfter, the processor 1 will continue looping on this microinstruction, reading each time the next value from the tester 6 via the data bus 24, until reset by the tester 6. By successively using each of these microinstructions, the tester 6 can selectively verify the functionality of the residual control PLAs 19 through 22.

Figure 7:
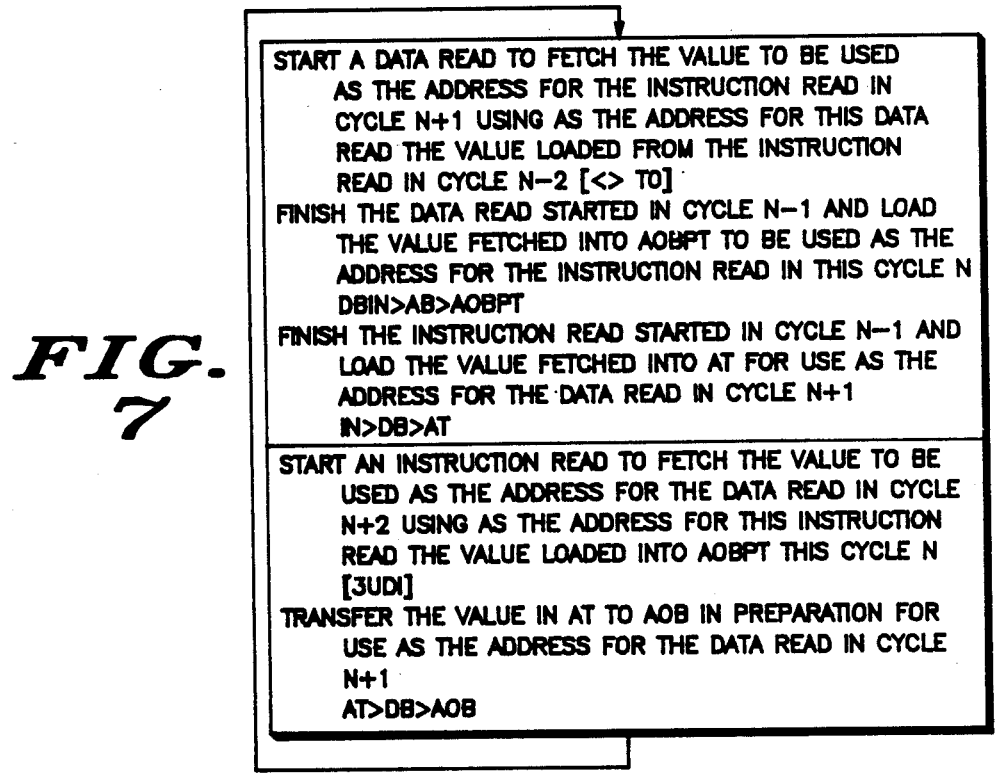
FIG. 7 is a flow diagram of a microcoded test routine for testing the instruction cable of the processor of FIG. 1.

In preparation for testing the instruction and tag caches 7 and 8, respectively, the tester 6 must prepare a valid stack frame, with the address of the first microinstruction in Appendix IV hereto in the MICRO PC field. At the appropriate point in the testing sequence, the tester 6 may thereafter provide the RTE instruction in the instruction stream of the processor 1 via the data bus 24. In response, the processor 1 will initiate a data operand cycle, providing via the address bus 27 a "data address" value which has been initialized by the tester 6 in the AOB field of the stack frame. The processor 1 will then accept from the tester 6 via the data bus 24 an "instruction address" value. Using this "instruction address" value, the processor 1 attempts to access the instruction cache 7 via the tag cache 8. Since both the instruction cache 7 and the tag cache 8 will be initially empty, there should be no "hit" in the tag cache 8. The processor 1 will therefore automatically initiate an instruction operand cycle, providing the "instruction address" value on the address bus 27. The processor 1 will then accept from the tester 6 via the data bus 24 an "instruction" value. Since the instruction access "missed", the instruction cache 7 will automatically load this "instruction+ value while the tag cache 8 concurrently loads the corresponding "instruction address" value. After substituting this new "instruction" value for the current "data address" value, the processor 1 repeats the cycle illustrated by flow diagram 94 in FIG. 7. By returning an appropriate sequence of values, the tester 6 can induce the processor 1 to sequentially fill up both the instruction cache 7 and the tag cache 8. If the tester 6 then provides in response to a subsequent data operand cycle an "instruction address" value which causes a "hit" in the tag cache 8, the processor 1 will substitute the corresponding "instruction" value retrieved from the instruction cache 7 for the current "data address" value and then proceed to the next cycle. In this manner, the tester 6 can determine the functionality of the instruction cache 7 by comparing the "instruction" values which should have been loaded into the instruction cache 7 to the "data addresses" which are provided for the respective data operand cycles. Similarly, the tester 6 can determine the functionality of the tag cache 8 by verifying that the "data addresses" and "instruction addresses" are as they should be if the tag cache 8 "hits" or "no hits", respectively.

Although the present invention has been described in the context of testing certain portions of the circuitry of the data processor 1, it will be apparent that other portions may also be tested efficiently using this technique in processors having suitable circuit configurations. In addition, the mechanism for providing direct entry into the microcode may be employed advantageously in other applications. For example, a special microroutine may be provided to implement an instruction not available in the standard instruction set. This special instruction may be a modified form of an existing instruction or one which is unique to a particular class of application or customer. In such situations, the microcode will be appropriately constructed to implement the desired functionality. The general formate for such microinstructions, including those set forth in Appendices II through IV, is shown in Appendix V.

APPENDIX I

```
 3                        1  1                       0
 1                        6  5                       0
 +------------------------+------------------------+
 |         PSW            |      REAL PC.H         |
 +------------------------+------------------------+
 |       REAL PC.L        |    1011 : VECTOR #     |
 +------------------------+------------------------+
 |        SSWB.H          |        SSWB.L          |
 +------------------------+------------------------+
 |        IM/IRC          |         IRB            |
 +------------------------+------------------------+
 |        PADS.H          |        PADS.L          |
 +------------------------+------------------------+
 |         AOB.H          |         AOB.L          |
 +------------------------+------------------------+
 |         DOB.H          |         DOB.L          |
 +------------------------+------------------------+
 |          IRD           |          IR            |
 +------------------------+------------------------+
 |        AOBPT.H         |        AOBPT.L         |
 +------------------------+------------------------+
 |         TP1.H          |         TP1.L          |
 +------------------------+------------------------+
 |         TP2.H          |         TP2.L          |
 +------------------------+------------------------+
 |         DBIN.H         |         DBIN.L         |
 +------------------------+------------------------+
 |         IRC2           |          IRA           |
 +------------------------+------------------------+
 |        SSWI*           |      MICRO PC**        |
 +------------------------+------------------------+
 |        ALUT.H          |        ALUT.L          |
 +------------------------+------------------------+
 |        SPARE           |        SPARE           |
 +------------------------+------------------------+
 |         DT.H           |         DT.L           |
 +------------------------+------------------------+
 |         PER.H          |         PER.L          |
 +------------------------+------------------------+
 |      SHFTCNTRL.H       |      SHFTCNTRL.L       |
 +------------------------+------------------------+
 |         AT.H           |         AT.L           |
 +------------------------+------------------------+
 |         REGB.H         |         REGB.L         |
 +------------------------+------------------------+
 |         REGA.H         |         REGA.L         |
 +------------------------+------------------------+
 |         AUT.H          |         AUT.L          |
 +------------------------+------------------------+
```

*WHERE SSWI HAS THE FOLLOWING FORMAT:

```
+---+---+---+---+---+---+---+---+---+---+---+---+---+---+---+---+
|   | F | F | T |   |   |   |   |   |   |   |   |               |
| Ø | P | P | P | Ø | Ø | Ø | Ø | Ø | Ø | Ø | Ø |   AR LATCH    |
|   | 2 | 1 |   |   |   |   |   |   |   |   |   |               |
+---+---+---+---+---+---+---+---+---+---+---+---+---+---+---+---+
 15  14  13  12  11  10   9   8   7   6   5   4   3   2   1   0
```

**AND WHERE MICRO PC HAS THE FOLLOWING FORMAT:

```
+---+---+---+---+---+---+---+---+---+---+---+---+---+---+---+---+
|               | C |                                           |
|   REV NUMBER  | R |         MICRO PROGRAM COUNTER             |
|               | C |                                           |
+---+---+---+---+---+---+---+---+---+---+---+---+---+---+---+---+
 15  14  13  12  11  10   9   8   7   6   5   4   3   2   1   0
```

APPENDIX II

1ST PLA DIAGNOSTIC ROUTINE
ENTERED BY RTE

```
+---+---------+-----+---------------+-----+
|JC8| DGPA1   | 49d |               | DB  |
+---+-----+---+--+--+-----+---------+-----+
|BYTE|INST|   RX  |   RY  |  .            |
+----+----+-------+-------+---------------+
| "LOAD IRD(C)"                   | ADD   |
|  AUT>DB>IRB                     | NIL   |
| "INCREMENT & BUILD IRD(D)"      |  X    |
|  AUT>DB>AU>AUT                  |  X    |
|  1>AU                           |  X    |
| "PLA SELECTED BY AR LATCH"      | NONE  |
|                                 |  NF   |
|                                 | CTOD  |
|                                 |       |
|                                 | 12/07 |
+---------------------------------+-------+
   JD8      DGPA1    (JC8)
```

2ND PLA DIAGNOSTIC ROUTINE
ENTERED BY RTE

```
+---+---------+-----+---------------+-----+
|JE8| DGPB1   | 73c |               | DB  |
+---+-----+---+--+--+-----+---------+-----+
|WORD|DATA|   RX  |   RY  | <>  TØ        |
+----+----+-------+-------+---------------+
| "READ VALUE TO BE TESTED, IRD(D)|  X    |
| "PLA SELECTED BY AR LATCH"      | NIL   |
|  DBIN>DB>IRB                    |  X    |
|                                 |  X    |
|                                 |  X    |
|                                 | NONE  |
|                                 |  NF   |
|                                 | CTOD  |
|                                 |       |
|                                 | 12/07 |
+---------------------------------+-------+
   JF8      DGPB1    (JE8)
```

```
A5 PLA DIAGNOSTIC ROUTINE
ENTERED BY RTE
+---+--------+-----+--------------+-----+
|JD9| DGPC1  | 73e |              | DB  |
+---+-+------+--+--+-+------------+-----+
| LONG|INST|   RX|    RY| <>  TØ        |
+-----+----+-----+------+---------------+
| "READ NEXT IRD:IRC2 VALUE"         X  |
| "LOAD IRC2"                        NIL|
| DBIN>DB>>IRA                       X  |
| "SHIFT IRD"                        ZXTD|
| DBIN>DB>>REGA                      X  |
| "PLA SELECTED BY AR LATCH"         NONE|
| "NEED SHFTCNT INITIALIZED"         NF |
|                                    STIRA|
|                                       |
|                                    12/Ø5|
+---+--------+-----+--------------+-----+
|JE9| DGPC2  | 73f |              | DB  |
+---+-+------+--+--+-+------------+-----+
|    X|DATA|   RX|    RY| .             |
+-----+----+-----+------+---------------+
| "LOAD NEW IRD"                     X  |
| REGB>DB>IRB                        NIL|
|                                    X  |
|                                    X  |
|                                    X  |
|                                    NONE|
|                                    NF |
|                                    CTOD|
|                                       |
|                                    12/Ø5|
+--------------------------------+------+
  JF9      DGPC1    (JD9)
```

APPENDIX III

```
IRD PLA - COLUMN 1 - DIAGNOSTIC ROUTINE
ENTERED BY RTE
+---+--------+-----+--------------+-----+
|JA6| DGPI1  | 7bØ |              | DB  |
+---+-+------+--+--+-+------------+-----+
| WORD|DATA|   RX|    RY| <>  TØ        |
+-----+----+-----+------+---------------+
| "READ VALUE TO BE TESTED (F)"      X  |
| DBIN>DB>IRB                        AND|
| "USE CRC (A) AS NEXT ADDRESS"      CC1|
| REGB>AB>>AOB                       X  |
| "PLA SELECTED BY AR LATCH"         DIAG1|
|                                    STCRC|
|                                    NF |
|                                    CTOD|
|                                       |
|                                    12/11|
+--------------------------------+------+
  JB6      DGPI1    (JA6)
```

IRD PLA - COLUMN 2 - DIAGNOSTIC ROUTINE
ENTERED BY RTE

```
+---+--------+------+--------------+-----+
|JC6| DGPI2  | 7b1  |              | DB  |
+---+-+------+-+----+-+------+-----+-----+
| WORD|DATA|  RX|    RY| <>   T0         |
+-----+----+------+------+---------+-----+
| "READ VALUE TO BE TESTED (F)"    |   X |
| DBIN>DB>IRB                      | COL2|
| "USE CRC (A) AS NEXT ADDRESS"    | CC2 |
| REGB>AB>>AOB                     |   X |
| "PLA SELECTED BY AR LATCH"       |DIAG2|
|                                  |STCRC|
|                                  |  NF |
|                                  |CTOD |
|                                  |     |
|                                  | 1/02|
+----------------------------------+-----+
  JD6      DGPI2   (JC6)
```

IRD PLA - COLUMN 3 - DIAGNOSTIC ROUTINE
ENTERED BY RTE

```
+---+--------+------+--------------+-----+
|JE6| DGPI3  | 7b2  |              | DB  |
+---+-+----+--+----+-+-----+-------+-----+
| WORD|DATA|  RX|    RY| <>   T0         |
+-----+----+------+------+---------+-----+
| "READ VALUE TO BE TESTED (F)"    |   X |
| DBIN>DB>IRB                      | COL3|
| "USE CRC (A) AS NEXT ADDRESS"    | CC3 |
| REGB>AB>>AOB                     |   X |
| "PLA SELECTED BY AR LATCH"       |DIAG3|
|                                  |STCRC|
|                                  |  NF |
|                                  |CTOD |
|                                  |     |
|                                  | 1/02|
+----------------------------------+-----+
  JF6      DGPI3   (JE6)
```

IRD PLA - COLUMN 4 - DIAGNOSTIC ROUTINE
ENTERED BY RTE

```
+---+--------+------+--------------+-----+
|JA7| DGPI4  | 7e3  |              | DB  |
+---+-+----+-+-+---+-+-----+-------+-----+
| WORD|DATA|  RX|    RY| <>   T0         |
+-----+----+------+------+---------+-----+
| "READ VALUE TO BE TESTED (F)"    |   X |
| DBIN>DB>IRB                      | NIL |
| "USE CRC (A) AS NEXT ADDRESS"    |   X |
| REGB>AB>>AOB                     |   X |
| "PLA SELECTED BY AR LATCH"       |DIAG4|
|                                  |STCRC|
|                                  |  NF |
|                                  |CTOD |
|                                  |     |
|                                  | 1/02|
+----------------------------------+-----+
  JB7      DGPI4   (JA7)
```

IRD PLA - COLUMN 5 - DIAGNOSTIC ROUTINE
ENTERED BY RTE

| JC7 | DGPI5 | 7e8 | | DB |
|---|---|---|---|---|
| WORD | DATA | RX | RY <> TØ | |
| "READ VALUE TO BE TESTED (F)" | | | | X |
| DBIN>DB>IRB | | | | NIL |
| "USE CRC (A) AS NEXT ADDRESS" | | | | X |
| REGB>AB>>AOB | | | | X |
| "PLA SELECTED BY AR LATCH" | | | | DIAG5 |
| | | | | STCRC |
| | | | | NF |
| | | | | CTOD |
| | | | | 1/02 |

JD7   DGPI5   (JC7)

IRD PLA - COLUMN 6 - DIAGNOSTIC ROUTINE
ENTERED BY RTE

| JE7 | DGPI6 | 499 | | DB |
|---|---|---|---|---|
| WORD | DATA | RX | RY <> TØ | |
| "READ VALUE TO BE TESTED (F)" | | | | X |
| DBIN>DB>IRB | | | | NIL |
| "USE CRC (A) AS NEXT ADDRESS" | | | | X |
| REGB>AB>>AOB | | | | X |
| "PLA SELECTED BY AR LATCH" | | | | DIAG6 |
| | | | | STCRC |
| | | | | NF |
| | | | | CTOD |
| | | | | 1/02 |

JF7   DGPI6   (JE7)

IRD PLA - COLUMN 7 - DIAGNOSTIC ROUTINE
ENTERED BY RTE

| JA8 | DGPI7 | 49b | | DB |
|---|---|---|---|---|
| WORD | DATA | RX | RY <> TØ | |
| "READ VALUE TO BE TESTED (F)" | | | | X |
| DBIN>DB>IRB | | | | NIL |
| "USE CRC (A) AS NEXT ADDRESS" | | | | X |
| REGB>AB>>AOB | | | | X |
| "PLA SELECTED BY AR LATCH" | | | | DIAG7 |
| | | | | STCRC |
| | | | | NF |
| | | | | CTOD |
| | | | | 1/02 |

JB8   DGPI7   (JA8)

APPENDIX IV

```
CACHE DIAGNOSTIC ROUTINE
ENTERED BY RTE
+---+---------+-----+--------------+-----+
|JA9| DGCA1   | 7ea |              | DB  |
+---+-+----+--+---+-+----+---------+-----+
| LONG|INST|   RX|   RY| <>  TØ          |
+-----+----+-----+-----+---------+-----+
|   "USE PREVIOUS CACHE ACCESS"      X  |
|   "DATA AS AN ADDRESS (2 BACK)"    NIL|
|   IN>DB>AT                         X  |
|   "READ NEXT ADDRESS TO BE CHECKED X  |
|   DBIN>AB>AOBPT                    X  |
|                                    NONE
|                                    JMP2
|                                    UPIPE
|                                         |
|                                    2/13|
+---+---------+-----+--------------+-----+
|JB9| DGCA2   | 74b |DBCC2    (EQ7)| DB  |
+---+-+----+--+---+-+----+---------+-----+
|    X|DATA|   RX|   DTY| .               |
+-----+----+-----+-----+---------+-----+
|   "ACCESS TEST ADDRESS"            X  |
|   "STORE ADDRESS"                % COL3
|   AT>DB>AOB                        X  |
|                                    X  |
|                                    X  |
|                                    NONE
|                                    3PFI
|                                    3UDI
|                                         |
|                                    1/Ø8|
+---------------------------------+-----+
 JC9       DGCA1    (JA9)
```

APPENDIX V
MICROINSTRUCTION LISTING

```
    +--- CO-ORDINATE OF BOX        MICRO SEQUENCER
    |   +--- LABEL OF BOX             INFORMATION
    |   |   +-- MICRO ADDRESS         |
    |   |   |   +-- ORIGIN            |
    V   V   V   V                     V
   +---+---------+-----+--------------+-----+
   |AA1| EXAM1   | 040 | EXAM1   (1)  | A1  |
   +---+-+---+---+-+---+-+------------+-----+
   |SIZE |PADB|  RXS|  RYS| R/W TIME TYPE|
   +-----+----+-----+-----+--------------+
   | "COMMENTS"                     | AU   |
   | TRANSFERS                      | ALU  |
   |    >> T1 DESTINATION           | CC   |
   |    >  T3 DESTINATION           | SHFTO|
   |                                | SHFTC|
   |                                | FTU  |
   |                                | PC   |
   |                                | PIPE |
   |                                |      |
   |                                | DATE |
   +--------------------------------+------+
```

ORIGIN: if shared, co-ordinate of origin
       if origin, # of boxes sharing with this box

DATA ACCESS INFORMATION:

```
R/W                           TIME
    .    - no access             X  - no timing associated
   <W>   - write                 T1 - write to aob in T1
   <>    - read                  T3 - write to aob in T3
   SPC   - special signal        T0 - aob writen before T1
   EXL   - latch exception TYPE
   .,<>,<W> on R/W
      .     - normal access
      UNK   - program/data access
      CNORM - conditional normal
      CUNK  - conditional prog/data
      AS    - alternate address space
      CPU1  - cpu access - different bus error
      CPU2  - cpu access - normal bus error
      RMC   - read-modify-write access
   SPC on R/W
      RST1  - restore stage 1
      RST2  - restore stage 2
      HALT  - halt pin active
      RSET  - reset pin active
      SYNC  - synchronize machine
   EXL on R/W
      BERR  - bus error          PRIV - privilege viol.
      AERR  - address error      TRAC - trace
```

```
LINA  - line a              TRAP  - trap
LINF  - line f              COP   - protocol viol.
ILL   - illegal             FORE  - fomat error
DVBZ  - divide by zero      INT   - interrupt 1st stack
BDCK  - bad check           INT2  - interrupt 2nd stack
TRPV  - trap on overflow    NOEX  - no exception
```

MICRO SEQUENCER INFORMATION:

```
DB   - direct branch - next microaddress in microword
BC   - conditional branch
A1   - use the A1 PLA sample interrupts and trace
A1A  - use the A1 PLA sample interrupts, do not sample
       trace
A1B  - use the A1 PLA do not sample interrupts or trace
A2   - use the A2 PLA
A7   - functional conditional branch (DB or A2 PLA)
A4   - use the A4 latch as next micro address
A5   - use the A5 PLA
A6   - use the A6 PLA
```

SIZE:

```
size = byte     nano specified constant value
size = word     nano specified constant value
size = long     nano specified constant value
size = ircsz    irc[11]=0/1 => word/long
size = irsz     ird decode of the instruction size
                (byte/word/long). Need to have file
                specifying residual control
size = ssize    shifter control generates a size
                value. The latch in which this value
                is held has the following encoding
                    000 = byte
                    001 = word
                    010 = 3-byte
                    011 = long
                    100 = 5-byte *** must act as
                          long sized
```

RXS - RX SUBSTITUTIONS:

RX is a general register pointer. It is used to point at either special purpose registers or user registers. RX generally is used to translate a register pointer field within an instruction into the control required to select the the appropriate register.

```
rx = rz2d/rxd   conditionally substitute rz2d
                use rz2d and force rx[3]=0
                  mul.l         0100 110 000 xxx xxx
                  div.l         0100 110 001 xxx xxx
rx = rx         ird[11:9] muxed onto rx[2:0]
                rx[3] = 0 (data reg.)
                    (unless residual points)
                rxa then rx[3] = 1
                    (residual defined in opmap)
```

| | | |
|---|---|---|
| rx = rz2 | irc2[15:12] muxed onto rx[3:0]<br>rx[3] is forced to 0 by residual control<br>  div.1         0100 110 001 xxx xxx<br>  bit field reg   1110 1xx 111 xxx xxx | |
| rx = rp | rx[3:0] = ar[3:0]<br>The value in the ar latch must be inverted before going onto the rx bus for movem r1,-(ry) 0100 100 01x 100 xxx | |
| rx = rz | irc[15:12] muxed onto rx[3:0]<br>(cannot use residual control) | |
| rx = ro2 | rx[2:0] = irc2[8:6]<br>rx[3] = 0 (data reg.)<br>Used in Bit Field, always data reg | |
| rx = car | points @ cache address register | |
| rx = vbr | points @ vector base register | |
| rx = vatl | points @ vatl | |
| rx = dt | points @ dt | |
| rx = crp | rx[3:0] = ar[3:0]<br>The value in ar points at a control register (i.e. not an element of the user visible register array) | |
| rx = usp | rx[3:0] = F<br>force effect of psws to be negated (0) | |
| rx = sp | rx[2:0] = F,<br>  if psws=0 then address  usp<br>  if psws=1 & pswm=0 then isp<br>  if psws=1 & pswm=1 then msp | |

RYS - RY SUBSTITUTIONS:

| | |
|---|---|
| ry = ry | ird[2:0] muxed onto ry[2:0]<br>ry[3] = 1 (addr reg.) unless residual points<br>ryd then ry[3] = 0. (residual defined in opmap) |
| ry = ry/dbin<br>    ry/dob | This is a conditional substitution for the normal ry selection (which includes the residual substitutions like dt) with dbin or dob. The substitution is made based on residual control defined in opmap (about 2 ird lines) which selects the dbin/dob and inhibits all action to ry (or the residually defined ry). Depending upon the direction to/from the rails dbin or dob is selected. |

If the transfer is to the rails then dbin is substituted while if the transfer is from the rails dob is substituted.

Special case: IRD = 0100 0xx 0ss 000 xxx (clr,neg,negx,not) where if driven onto the a-bus will also drive onto the d-bus.

ry = rw2    irc2[3:0] muxed onto ry[3:0]
   use rw2
```
      movem ea,rl   0100 110 01x xxx xxx
      div.l         0100 110 001 xxx xxx
      bfield        1110 xxx xxx xxx xxx
      cop           1111 xxx xxx xxx xxx
```
   do not allow register to be written to
```
      div.w         1000 xxx x11 xxx xxx
```
   force ry[3] = 0
```
      div.l         0100 110 001 xxx xxx
      bfield        1110 1xx x11 xxx xxx
``` ry = rw2/dt   conditionally substitute rw2 or dt
   use rw2 and force ry[3]=0
```
      mul.l         0100 110 000 xxx xxx
                    and irc2[10] = 1
      div.l         0100 110 001 xxx xxx
                    and irc2[10] = 1
``` ry = vdtl    points @ virtual data temporary ry = vat2    points @ virtual address temporary 2 ry = dty     points @ dt

AU - ARITHMETIC UNIT OPERATIONS:

0- ASDEC    add/sub    add/sub based on residual control
                      sub if ird = xxxx xxx xxx 100 xxx 1- ASXS     add/sub    add/sub based on residual (use alu add/sub). Do not extend db entry add if ird = 1101 xxx xxx xxx xxx add
                         or   0101 xxx 0xx xxx xxx addq 2- SUB      sub        subtract AB from DB 3- DIV      add/sub    do add if aut[31] = 1,
                        sub if aut[31] = 0; take db (part rem) shift by 1 shifting in alut[31] then do the add/sub.

4- NIL

6- SUBZX    sub        zero extend DB according to size then sub AB

8- ADDX8    add    sign extend DB 8 -> 32 bits then
                   add to AB 9- ADDX6    add    sign extend DB 16 -> 32 bits then
                   add to AB 10- ADD     add    add AB to DB 11- MULT    add    shift DB by 2 then add constant
                   sign/zero extend based on residual
                   and previous aluop
                     muls = always sxtd
                     mulu = sxtd when sub in previous
                            aluop 12- ADDXS   add    sign extend DB based on size then
                   add to AB 13- ADDSE   add    sign extend DB based on size then
                   shift the extended result by 0,1,2,3
                   bits depending upon irc[10:9].
                   Finally add this to AB 14- ADDZX   add    zero extend DB according to size then
                   add to AB 15- ADDSZ   add    zero extend DB according to size,
                   shift by 2, then add

CONSTANTS 0,1         1 selected by:
              (div * allzero) + (mult * alu carry = 0)

1,2,3,4     selected by size
              byte = 1
              word = 2
              3-by = 3
              long = 4

If (Rx=SP or Ry=SP) and (Ry=Ry or Rx=Rx) and (Rx or Ry is
a source and destination) and (au constant = 1,2,3,4) and
(size = byte) then constant = 2 rather than one.

ALU - ARITHMETIC AND LOGIC UNIT OPERATIONS:

col0 = x,nil
    col1 = and
    col2 = alu1,div,mult,or
    col3 = alu2,sub

| row |         | col 1 | col 2 | col 3 |
|-----|---------|-------|-------|-------|
| 1   | ADDROW  | and   | add   |       |
| 2   | ADDXROW | and   | addx  | add   |
| 3   | SUBROW  | and   | sub   |       |

| | | | | |
|---|---|---|---|---|
| 4 | SUBXROW | and | subx | addl |
| 5 | DIVROW | and | div | sub |
| 6 | MULTROW | and | mult | sub |
| 7 | ANDROW | and | and | |
| 8 | EORROW | and | eor | |
| 9 | ORROW | and | or | add |
| 10 | NOTROW | and | not | |
| 11 | CHGROW | and | chg | |
| 12 | CLRROW | and | clr | |
| 13 | SETROW | and | set | |

```
                              cin
add     db + ab               0
addx    db + ab               x
addl    db + ab               1
and     ab ^ db               -
chg     ab xor k=-1           -
clr     ab ^ k=0              -
eor     ab xor db             -
not     ~ab v db              -
or      ab v db               -
set     ab v k=-1             -
sub     db + ab               1
subx    db + ab               x
mult    (db shifted by 2) add/sub (ab shifted by 0,1,2
        (if 0 then add/sub 0)) control for add/sub and
        shift amount comes from regb. Don't assert atrue
        for mult
                              cin = 0
div     build part. quot and advance part. remain.1
        ab (pr.1:pq) shifted by 1, add0,
        value shifted in = au carry (quot bit)
                              cin = 0
        must assert atrue for div
```

The condition codes are updated during late T3 based upon the data in alut and/or rega. These registers can be written to during T3. In the case of rega, there are times when the value to be tested is the result of an insertion from regb.

CC - CONDITION CODE UPDATE CONTROL:

| row | | col 1 | | col 2 | | col 3 | |
|---|---|---|---|---|---|---|---|
| 1 | add | cnzvc | | ddddd | | ddddd | |
| 2 | addx | cnzvc | | ddkdc | (bcd1) | cdzdc | (bcd2) |
| 3 | sub | cnzvc | | knzvc | (cmp) | ddddd | |
| 4 | subx | cnzvc | | ddkdc | (bcd1) | cdzdc | (bcd2) |
| 5 | div | knzv0 | (div) | ddddd | | ddddd | |
| 6 | mull | knzv0 | | ddddd | | ddddd | |
| 7 | rotat | knz0c | | ddddd | | ddddd | |
| 8 | rox | cnz0c | | knz00 | | kkkvk | |
| 9 | bit,bitfld | kkzkk | (bit) | knz00 | (bfld1) | kkzkk | (bfld2) |
| 10 | log | knz00 | | ddddd | | ddddd | |

```
standard
  n = alut msb (by size)
```

```
z = alut=0 (by size)

non-standard
  add     c = cout
          v = vout
  addx.1  c = cout
          z = pswz ^ locz
          v = vout
  bcd1    c = cout
  bcd2    c = cout v pswc
          z = pswz ^ locz
  bfld1   n = shiftend
          z = all zero
  bfld2   z = pswz ^ allzero
  bit     z = allzero
  div     v = au carry out
  mull    n = (shiftend ^ irc2[10]) v
              (alut[31] ^ ~irc2[10])
          z = (alut=0 ^ shift allzero ^ irc2[10]) v
              (alut=0 ^ ~irc2[10])
          v = ~irc2[10] ^ ((irc2[11] ^ (~allzero ^
              ~alut[31]) v (~allone ^ alut[31])) v
              (~irc2[11] ^ ~allzero))
  rotat   c = shiftend = (sc=0 - 0   sc<>0 - end)
  rox.1   c = shiftend = (sc=0 - pswx  sc<>0 - end)
          ! can do this in two steps as knz0c where
          ! c=pswx and cnz0c where c=shiftend (not
          ! with share row with shift)
  rox.3   v = shift overflow = ((~allzero ^ sc>sz) v
              (~(allzero v allones) ^ sc<=sz))
          ! can simplify this if we don't share
          ! rows but it will cost another box
  sub.1   c = ~cout
          v =  vout
  sub.2   c = ~cout
          v =  vout
  subx.1  c = ~cout
          z = pswz ^ locz
          v =  vout
  subx.2  c = ~cout
  subx.3  c = ~cout v pswc
          z = pswz ^ locz
```

The meaning and source of signals which are used to set the condition codes is listed below:

```
  allzero = every bit in rega field = 0 where the
            field is defined as starting at the bit
            pointed to by start and ending (including)
            at the bit pointed to by end.
            (see shift control)

allone  = every bit in rega field = 1 where the
            field is defined as starting at the bit
            pointed to by start and ending (including)
            at the bit pointed to by end.
            (see shift control)
``` shiftend = the bit in rega pointed to by end = 1.
(see shift control)

locz    = all alut for the applicable size = 0.

SHFTO - SHIFTER OPERATIONS:

ror     value in rega is rotated right by value in shift
           count register into regb.

sxtd    value in rega defined by start and end registers
           is sign extended to fill the undefined bits and
           that value is rotated right by the value in the
           shift count register. The result is in regb.

xxtd    value in rega defined by start and end registers
           is PSWX extended to fill the undefined bits and
           that value is rotated right by the value in the
           shift count register. The result is in regb.

zxtd    value in rega defined by start and end registers
           is zero extended to fill the undefined bits and
           that value is rotated right by the value in the
           shift count register. The result is in regb.

ins     the value in regb is rotated left by the value in
           shift count register and then inserted into the
           field defined by the start and end register in
           rega. Bits in rega that are not defined by start
           and end are not modified.

boffs   provides the byte offset in regb. If irc2[11]=1
           then the offset is contained in RO and as such
           rega should be sign extended from rega to regb
           using the values established in start, end, and
           shift count of 3,31,3 respectively. If irc2[11]=0
           then the offset is contained in the immediate
           field and should be loaded from irc2[10:6] or
           probably more conveniently osr[4:0]. This value
           however should be shifted by 3 bits such that
           osr[4:3] are loaded onto regb[1:0] with zero
           zero extension of the remaining bits.

offs    provides the offset in regb. If irc2[11]=1 then
           the offset is contained in RO and as such DB>REGB
           should be allowed to take place. If irc2[11]=0
           then the offset is contained in the immediate
           field and osr[4:0] should be loaded onto regb[4:0]
           with zero extension of the remaining bits.

SHFTC - SHIFTER CONTROL:

|     | {sbm1}        |         | {sbm2}      |
| --- | ---           | ---     | ---         |
| BIT | st = 0        |         | st = wr - 8 |
| bit | en = -1       | (31)    | en = wr - 1 |
| mvp | sc = wr       | (16,32) | sc = wr - 8 |
| swap| wr = BC[12:7] | (16,32) | wr = wr - 8 |

```
callm           osr = x                              osr = x
                cnt = x                              cnt = x {sbm3}                               {sbm4}
        st = DB [5:0] mod sz                 st = 0
        en = DB [5:0] mod sz                 en = -1           (31)
        sc = 0                               sc = wr
        wr = DB [5:0]                        wr = wr
        osr = x                              osr = x
        cnt = x                              cnt = x {sbm5}                               {sbm6}
        st = x                               st = 16
        en = x                               en = 31
        sc = x                               sc = 16
        wr = DB [7:2]                        wr = wr - 1
        osr = x                              osr = x
        cnt[1:0] = DB [1:0]                  cnt = x { }
        st = x
        en = x
        sc = x
        wr = x
        osr = x
        cnt = x {mul1}                               {mul2}
MUL     st = wr                              st = wr - 2
mulw    en = -1 mod sz    (15,31)            en = wr
mull    sc = wr                              sc = wr - 2
        wr = BC[12:7]     (14,30)            wr = wr - 2
        osr = x                              osr = x
        cnt = x                              cnt = x {mul3}                               {mul4}
        st = 0                               st = 0
        en = -1            (31)              en = en
        sc = x                               sc = x
        wr = x                               wr = x
        osr = x                              osr = x
        cnt = x                              cnt = x { }                                  {mul6}
        st = x                               st = 16
        en = x                               en = 31
        sc = x                               sc = 16
        wr = x                               wr = x
        osr = x                              osr = x
        cnt = x                              cnt = x { }
        st = x
        en = x
        sc = x
        wr = x
```

```
             osr = x
             cnt = x

{divw1}                          {divw2}
divw     st = 0                           st = 0
         en = 31                          en = -1 mod sz    (15)
         sc = wr            (16)          sc = 16
         wr = BC[12:7]      (16)          wr = wr - 1
         osr = x                          osr = x
         cnt = x                          cnt = x {divw3}                          {divw4}
         st = wr            (16)          st = 0
         en = -1            (31)          en = 31
         sc = wr            (16)          sc = wr
         wr = BC[12:7]      (16)          wr = x
         osr = x                          osr = x
         cnt = x                          cnt = x {divw5}                          {divw6}
         st = 4                           st = 16
         en = -1 mod size   (7)           en = 31
         sc = 28                          sc = 16
         wr = x                           wr = x
         osr = x                          osr = x
         cnt = x                          cnt = x {divw7}
         st = st
         en = -1            (31)
         sc = 0
         wr = x
         osr = x
         cnt = x {divl1}                          {divl2}
divl     st = wr - 1        (31)          st = 0
         en = -1            (31)          en = -1            (31)
         sc = x                           sc = 0
         wr = BC[12:7]      (32)          wr = wr - 1
         osr = x                          osr = x
         cnt = x                          cnt = x {divl3}                          {divl4}
         st = 0                           st = 0
         en = -1            (31)          en = 31
         sc = 0                           sc = 0
         wr = x                           wr = x
         osr = x                          osr = x
         cnt = x                          cnt = x {}                               {divl6}
         st = x                           st = 16
         en = x                           en = 31
         sc = x                           sc = 16
         wr = x                           wr = x
         osr = x                          osr = x
         cnt = x                          cnt = x
```

|     | | |
|---|---|---|
| | { }<br>st = x<br>en = x<br>sc = x<br>wr = x<br>osr = x<br>cnt = x | |
| unk | { }<br>st = x<br>en = x<br>sc = x<br>wr = x<br>osr = x<br>cnt = x | { }<br>st = x<br>en = x<br>sc = x<br>wr = x<br>osr = x<br>cnt = x |
| | { }<br>st = x<br>en = x<br>sc = x<br>wr = x<br>osr = x<br>cnt = x | { }<br>st = x<br>en = x<br>sc = x<br>wr = x<br>osr = x<br>cnt = x |
| | { }<br>st = x<br>en = x<br>sc = x<br>wr = x<br>osr = x<br>cnt = x | {unk6}<br>st = 16<br>en = 31<br>sc = 16<br>wr = x<br>osr = x<br>cnt = x |
| | { }<br>st = x<br>en = x<br>sc = x<br>wr = x<br>osr = x<br>cnt = x | |
| asl | {asl1}<br>st = 0<br>en = osr + ~wr<br>sc = ~wr + 1<br>wr = DB [5:0] or BC[12:7] (Q)<br>osr = BC[5:0]    (8,16,32)<br>cnt = x | {asl2}<br>st = x<br>en = ~(wr-1) mod sz<br>sc = x<br>wr = wr<br>osr = osr<br>cnt = x |
| | {asl3}<br>st = 0<br>en = osr - 1<br>sc = x<br>wr = wr<br>osr = x<br>cnt = x | {asl4}<br>st = osr + ~wr<br>en = -1 mod sz<br>sc = x<br>wr = wr<br>osr = x<br>cnt = x |
| | { }<br>st = x | {asl6}<br>st = 16 |

```
                en = x                          en = 31
                sc = x                          sc = 16
                wr = x                          wr = x
                osr = x                         osr = x
                cnt = x                         cnt = x {}
                st = x
                en = x
                sc = x
                wr = x
                osr = x
                cnt = x {asr1}                          {asr2}
    asr         st = wr                         st = wr - 1
                en = osr - 1                    en = (wr - 1) mod sz
                sc = wr                         sc = x
                wr = DB [5:0] or BC[12:7] (Q)   wr = wr
                osr = BC[5:0]    (8,16,32)      osr = osr
                cnt = x                         cnt = x {asr3}                          {}
                st = osr - 1                    st = x
                en = osr - 1                    en = x
                sc = x                          sc = x
                wr = wr                         wr = x
                osr = osr                       osr = x
                cnt = x                         cnt = x {}                              {asr6}
                st = x                          st = 16
                en = x                          en = 31
                sc = x                          sc = 16
                wr = x                          wr = x
                osr = x                         osr = x
                cnt = x                         cnt = x {}
                st = x
                en = x
                sc = x
                wr = x
                osr = x
                cnt = x {rotl1}                         {rotl2}
    rotl        st = osr                        st = x
                en = -1          (31)           en = ~(wr - 1) mod sz
                sc = osr                        sc = x
                wr = DB [5:0] or BC[12:7] (Q)   wr = wr
                osr = BC[5:0]    (8,16,32)      osr = osr
                cnt = x                         cnt = x {rotl3}                         {}
                st = 0                          st = x
                en = 31                         en = x
```

```
              sc = ~(wr - 1) mod sz              sc = x
              wr = wr                            wr = x
              osr = osr                          osr = x
              cnt = x                            cnt = x {}                                 {rotl6}
              st = x                             st = 16
              en = x                             en = 31
              sc = x                             sc = 16
              wr = x                             wr = x
              osr = x                            osr = x
              cnt = x                            cnt = x {}
              st = x
              en = x
              sc = x
              wr = x
              osr = x
              cnt = x {rotr1}                            {rotr2}
       rotr   st = osr                           st = x
              en = -1           (31)             en = (wr - 1) mod sz
              sc = osr                           sc = x
              wr = DB [5:0] or BC[12:7] (Q)      wr = wr
              osr = BC[5:0]    (8,16,32)         osr = osr
              cnt = x                            cnt = x {rotr3}                            {}
              st = 0                             st = x
              en = 31                            en = x
              sc = wr mod sz                     sc = x
              wr = wr                            wr = x
              osr = osr                          osr = x
              cnt = x                            cnt = x {}                                 {rotr6}
              st = x                             st = 16
              en = x                             en = 31
              sc = x                             sc = 16
              wr = x                             wr = x
              osr = x                            osr = x
              cnt = x                            cnt = x {}
              st = x
              en = x
              sc = x
              wr = x
              osr = x
              cnt = x {roxl1}                            {roxl2}
       roxl   st = 0                             st = 0
              en = osr + ~wr    (14)             en = (osr - wr) mod sz
              sc = -1           (31)             sc = 0
```

```
                en = -1 mod sz                           en = osr + ~wr
                sc = (~(wr-1) + 1) mod sz                sc = ~wr + 1
                wr = DB [5:0] or BC[12:7]  (Q)           wr = wr
                osr = BC[5:0]      (8,16,32)             osr = osr
                cnt = x                                  cnt = x {rox15}                                  {rox16}
                st = (~(wr-1) + 1) mod sz                st = 16
                en = -1 mod sz                           en = 31
                sc = (~(wr-1) + 1) mod sz                sc = 16
                wr = wr                                  wr = wr - 1 - osr
                osr = osr                                osr = osr
                cnt = x                                  cnt = x {rox17}
                st = wr - 1
                en = osr - 1
                sc = 0
                wr = wr
                osr = osr
                cnt = x {roxr1}                                  {roxr2}
        roxr    st = wr                                  st = 0
                en = osr - 1                             en = (wr - 1) mod sz
                sc = wr                                  sc = 0
                wr = BC[12:7]      (1)                   wr = wr
                osr = BC[5:0]      (16)                  osr = osr
                cnt = x                                  cnt = x {roxr3}                                  {roxr4}
                st = 0                                   st = wr
                en = (wr-1) - 1                          en = osr - 1
                sc = (wr-1) + 24,16,0                    sc = wr
                wr = DB [5:0] or BC[12:7]  (Q)           wr = wr
                osr = BC[5:0]      (8,16,32)             osr = osr
                cnt = x                                  cnt = x {roxr5}                                  {roxr6}
                st = 0                                   st = 16
                en = (wr-1) - 1                          en = 31
                sc = (wr-1) + 24,16,0                    sc = 16
                wr = wr                                  wr = wr - 1 - osr
                osr = osr                                osr = osr
                cnt = x                                  cnt = x {roxr7}
                st = 0
                en = osr - wr
                sc = 0
                wr = wr
                osr = osr
                cnt = x
                {bfrg1}                                  {bfrg2}
        bfreg   st = 0                                   st = 0
                en = 31                                  en = wr - 1
                sc = osr + wr                            sc = 0
```

```
         wr = DB[4:0] or IRC2[4:0]          wr = wr
         osr = REGB[4:0] or IRC2[10:6]      osr = osr
         cnt = x                             cnt = x {bfrg3}                             {}
         st = 0                              st = x
         en = 31                             en = x
         sc = osr + wr                       sc = x
         wr = wr                             wr = x
         osr = osr                           osr = x
         cnt = x                             cnt = x {bfrg5}                             {bfrg6}
         st = x                              st = 16
         en = x                              en = 31
         sc = x                              sc = 16
         wr = wr                             wr = wr
         osr = x                             osr = osr
         cnt[1:0] = DB[1:0]                  cnt = x {bfrg7}
         st = 0
         en = 31
         sc = 25
         wr = x
         osr = x
         cnt = x {bfmt1}                             {bfmt2}
bfmt     st = 3                              st = 00:
                                                 ~(osr[2:0]+(wr-1))
         en = -1            (31)             en = (osr[2:0]+(wr-1))
                                                 [4:3]:~osr[2:0]
         sc = 3                              sc = 0
         wr = DB[4:0] or IRC2[4:0]           wr = wr
         osr = REGB[4:0] or IRC2[10:6]       osr = osr
         cnt = x                             cnt = (osr[2:0]+
                                                  (wr-1)) [5:3]

{bfmt3}                             {bfmt4}
         st = 0                              st = 00:
                                                 ~(osr[2:0]+(wr-1))
         en = 11:~osr[2:0]                   en = -1 mod sz    (7)
         sc = 0                              sc = 0
         wr = wr                             wr = wr
         osr = osr                           osr = x
         cnt = x                             cnt = x {bfmt5}                             {bfmt6}
         st = x                              st = 16
         en = x                              en = 31
         sc = x                              sc = 16
         wr = x                              wr = wr
         osr = x                             osr = osr
         cnt = x                             cnt = x {bfmt7}
```

```
            st = x
            en = x
            sc = x
            wr = x
            osr = x
            cnt = x {bfmi1}                          {bfmi2}
bfmi        st = 3                           st = 00:
                                                  ~(osr[2:0]+(wr-1))
            en = -1            (31)          en = (osr[2:0]+(wr-1))
                                                  [4:3]:~osr[2:0]
            sc = 3                           sc = 00:
                                                  ~(osr[2:0]+(wr-1))
            wr = DB[4:0] or IRC2[4:0]        wr = wr
            osr = REGB[4:0] or IRC2[10:6]    osr = osr
            cnt = x                          cnt = (osr[2:0]+
                                                   (wr-1)) [5:3]

{bfmi3}                          {bfmi4}
            st = 0                           st = 00:
                                                  ~(osr[2:0]+(wr-1))
            en = 11:~osr[2:0]                en = -1 mod sz    (7)
            sc = 11:~(osr[2:0]+(wr-1))       sc = 00:
                                                  ~(osr[2:0]+(wr-1))
            wr = wr                          wr = wr
            osr = osr                        osr = x
            cnt = x                          cnt = x {bfmi5}                          {bfmi6}
            st = 0                           st = 16
            en = 00:(osr[2:0]+(wr-1))        en = 31
            sc = 25+(00:                     sc = 16
                 (osr[2:0]+(wr-1)))
            wr = wr                          wr = wr
            osr = x                          osr = osr
            cnt[1:0] = DB [1:0]              cnt = x {bfmi7}
            st = 0
            en = 31
            sc = 25
            wr = x
            osr = x
            cnt = x
            {cop1}                           {cop2}
cop         st = x                           st = x
            en = x                           en = x
            sc = x                           sc = x
            wr = x                           wr = wr - 1
            osr = x                          osr = x
            cnt = x                          cnt = x {cop3}                           {cop4}
            st = x                           st = x
            en = x                           en = x
```

```
            sc  = x                          sc  = x
            wr  = x                          wr  = x
            osr = x                          osr = x
            cnt = x                          cnt = x {cop5}                           {cop6}
            st  = x                          st  = 16
            en  = x                          en  = 31
            sc  = x                          sc  = 16
            wr  = DB [7:2]                   wr  = x
            osr = x                          osr = x
            cnt[1:0] = DB [1:0]              cnt = x {cop7}
            st  = x
            en  = x
            sc  = x
            wr  = x
            osr = x
            cnt = x
```

*1* loaded based on ird[5] - if ird[5] = 0 then wr value comes from BC bus else value is loaded from regc.

FTU - FIELD TRANSLATION UNIT OPERATIONS:

3- LDCR     load the control register from regb. The register is selected by the value in ar[1:0], this can be gated onto the rx bus.

4- DPSW     load the psw with the value in regb. Either the ccr or the psw is loaded depending upon size. If size = byte then only load the ccr portion.

14- CLRFP     clear the f-trace pending latch. (fpend2 only)

17- LDSH2     load the contents of the shifter control registers from regb. These include wr,osr,count.

19- LDSWB     load the internal bus register from regb. This is composed of bus controller state information which must be accessed by the user in fault situations.

21- LDSWI     load the first word of sswi (internal status word) from regb. This is composed of tpend, fpend1, fpend2, ar latch 23- LDSH1     load the contents of the shifter control registers from regb. These include st,en,sc.

25- LDUPC    load micro pc into A4 from regb and check validity of rev #.

26- LDPER    load per with the value on the a-bus. (should be a T3 load). ab>per 28- LDARL    load the ar latch from regb. May be able to share with ldswi or ldswj 29- ØPSWM    clear the psw master bit.

33- RPER     load output of per into ar latch and onto bc bus. There are two operations which use this function, MOVEM and BFFFO. MOVEM requires the least significant bit of the lower word (16-bits only) that is a one to be encoded and latched into the AR latch and onto the BC BUS (inverted) so that it can be used to point at a register. If no bits are one then the end signal should be active which is routed to the branch pla. After doing the encoding, the least significant bit should be cleared.

For BFFFO it is necessary to find the most significant bit of a long word that is a one. This value is encoded into 6 bits where the most significant bit is the 32-bit all zero signal. Thus the following bits would yield the corresponding encoding.

| most sig bit set | per out | onto bc bus |
|---|---|---|
| 31 | 0 11111 | 1110 0000 |
| 16 | 0 10000 | 1110 1111 |
| 0 | 0 00000 | 1111 1111 |
| NONE | 1 11111 | 0000 0000 |

The output is then gated onto the BC bus where it is sign extended to an 8-bit value. It does not hurt anything in the BFFFO case to load the other latch (i.e. BFFFO can load the AR latch).
For BFFFO it does not matter if a bit is cleared.

34- STCR     store the control register in regb. The register is selected by the value in ar[1:0], this can be gated onto the rx bus.

37- STPSW    store the psw or the ccr in regb based on size. If size = byte then store ccr only with bits 8 - 15 as zeros.

38- ØPEND    store the psw in regb then set the supervisor bit and clear the trace bit in the psw. Tpend and Fpend are cleared. The whole psw is stored in regb.

39- 1PSWS store the psw in regb then set the supervisor bit and clear both trace bits in the psw. The whole psw is stored in regb.

40- STINST store IRD decoded information onto the BC bus and into regb. This data can be latched from the BC bus into other latches (i.e. wr & osr) by other control.

41- STIRD store the ird in regb.

43- STINL store the new interrupt level in pswi and regb. The three bits are loaded into the corresponding pswi bits. The same three bits are loaded onto bc bus [3:1] with bc bus [31:4] = 1 and [0] = 1, which is loaded into regb. Clear IPEND the following T1.

44- STV# store the format & vector number associated with the exception in regb.

```
+--+--+--+--+--+--+--+--+--+--+--+--+--+--+--+--+
| X| X|   FORMAT  | 0| 0|      VECTOR NUMBER     |
+--+--+--+--+--+--+--+--+--+--+--+--+--+--+--+--+
 15 14 13 12 11 10  9  8  7  6  5  4  3  2  1  0
```

47- STCRC store the contents of the CRC register in regb. Latch A4 with microaddress.

48 STSH2 store the contents of the shifter control registers into regb. These include wr,osr,count. Store high portion of shift control 50- STSWB store the internal bus register in regb. This is composed of bus controller state information which must be accessed by the user in fault situations.

52- STSWI store sswi (internal status word) in regb. The sswi is composed of tpend, ar latch, fpend1, fpend2

54- STSH1 store the contents of the shifter control registers into regb. These include st,en,sc.

56- STUPC store the micro pc in regb.

```
+--+--+--+--+---+--+--+--+--+--+--+--+--+--+--+--+
| REV NUMBER|CRC|         MICRO PC               |
+--+--+--+--+---+--+--+--+--+--+--+--+--+--+--+--+
 15 14 13 12  11 10  9  8  7  6  5  4  3  2  1  0
```

62- NONE

63- STPER    store the per onto the a-bus. (should be a
             T1 transfer). per>ab

PC - PC SECTION OPERATIONS:

```
                    AOBP[1]
                 0           1

31 - 3PFI   |  EV3FI    |  OD3FI  |
30 - 3PFF   |  TPF      |  EV3FI  |
```

0- NF
    aobpt>db>sas
    tp2>ab>sas

1- TPF
    aobpt>db>tp1
    aobpt>db>aup>aobp*,aobpt
    +2>aup
    tp1>tp2
    tp2>ab>sas 2- PCR
    tp2>ab>a-sect
    (if ry=pc then connect pc and address section)
    aobpt>db>sas 3- PCRF
    aobpt>db>tp1
    aobpt>db>aup>aobp*,aobpt
    +2>aup
    tp1>tp2
    tp2>ab>a-sect
    (if ry=pc then connect pc and address section)

4- JMP1
    tp2>db>a-sect
    a-sect>ab>aobpt

5- BOB
    aobpt>db>tp1
    tp1>tp2
    tp2>ab>sas

- EV3FI
    aobpt>db>tp1*
    aobpt>db>aup>aobpt
    +4>aup
    tp2>ab>sas

- OD3FI
    aobpt>db>aup>aobpt,tp2
    +2>aup
    tp2>ab>sas

```
 7- TRAP
        tp2>db>a-sect
        pc>ab>sas

8- TRAP2
        tp2>ab>a-sect
        aobpt>db>sas

9- JMP2
        a-sect>ab>aobpt
        aobpt>db>sas

10- PCOUT
        pc>ab>a-sect
        aobpt>db>sas

11- NPC   Conditional update based on cc=t/f
        tp2>db>aup,a-sect
        a-sect>ab>aup>aobpt 12- LDTP2
        a-sect>ab>tp2
        aobpt>db>sas 13- SAVE1
        pad>aobp
        aobpt>db>sas
        tp2>ab>sas 15- SAVE2
        aobp>db>tp1
        tp2>ab>sas
14- FIX
        aobpt>db>tp1
        tp2>ab>aobpt
        tp1>tp2

16- LDPC
        tp2>pc
        aobpt>db>sas
        tp2>ab>sas

PIPE - PIPE OPERATIONS:

Description of bit encodings.
    [6] = use irc
    [5] = change of flow
    [4] = fetch instruction
    [3:0] = previously defined pipe control
            functionality.
```

|   |   |   | AOBP[1] |        |        |
|---|---|---|---------|--------|--------|
|   |   |   |         | 0      | 1      |
| 0 1 1 3 - | | 3UDI | | EV3Fa  | OD3F   |
| 1 0 1 7 - | | 3UDF | | TUD    | EV3Fb  |

```
- EV3Fa
    chrl>irb
    chrh>pb>imh,iml,irc
    change of flow
    fetch instr

- EV3Fb
    chrl>irb
    chrh>pb>imh,iml,irc
    irc>ir                        ! implies use irc
    use pipe
    fetch instr

- OD3F
    chrl>pb>irc
    ! force miss regardless of whether odd or even
    change of flow
    fetch instr 0 0 0 0 - NUD
    x 1 0 0 0 - UPIPE
    use pipe 0 0 1 1 - FIX2                    Always transfer irb up pipe
    chr>irb                       to irc,im and if irb needs
    irb>pb>imh,iml,irc            to be replaced, do access
                                  and transfer chr to irb.
    ! force miss regardless of whether odd or even
    change of flow,
    fetch instr db>ird                        else load irb from d-bus.
    irb>pb>imh,iml,irc
    change of flow
    fetch instr 0 0 0 2 - IRAD
    ira>db 0 0 0 4 - IRTOD
    ir>ird 0 0 1 5 - FIX1
    chr>irb                       if irc needs to be replaced,
                                  do access and transfer chr
                                  to irb, else no activity.
    ! force miss regardless of whether odd or even
    change of flow
    fetch instr 1 0 0 6 - 2TOC
    irc2>irc
    irc>ir
    use pipe
```

```
0 0 0 8 - CLRA
        clear irc2[14]
        ira>ab 0 0 0 9 - STIRA
        db>>ira
        ira>pb>irc2

0 0 0 11 - ATOC
        db>>ira
        ira>pb>irc 0 0 1 13 - EUD
        chr>irb
        irb>pb>imh,iml
        fetch instr 1 0 0 14 - CTOD
        irc>ir,ird
        irb>irc
        use pipe 1 0 1 15 - TUD
        chr>irb
        irb>pb>imh,iml,irc
        irc>ir
        use pipe
        fetch instr 0 1 1 15 - TOAD
        chr>irb
        irb>pb>imh,iml,irc
        irc>ir
        change of flow
        fetch instr
``` zxtd 8 -> 32

We claim:

1. In a microcoded data processor using microcode comprising:

a microstore which stores a first plurality of microroutines, each microroutine having a different predetermined starting microaddress;

an instruction decoder which receives each of a plurality of instructions for execution by said processor and specifies the starting microaddress for a respective one of said first plurality of microroutines of each of said plurality of instructions; and a micromachine which executes the one of said first plurality of microroutines having the specified starting microaddress, to control the operation of the processor in the execution of the respective one of said instructions, wherein, in the execution of a predetermined instruction provided by a user, the processor also receives one of a plurality of user specified microaddresses directly from the user each of which cannot be generated by the micromachine, said one user specified microaddress accessing microcode of the data processor, and the micromachine thereafter controlling the operation of the processor in accordance with one of a second plurality of additional special function microroutines starting at said user specified microaddress, a method for direct entry by the user into the microcode comprising the steps of:

providing the second plurality of additional special function microroutines in the microstore, each microroutine of the second plurality having a user specified starting microaddress which is different from the starting microaddresses of said first plurality of microroutines;

selectively coupling said predetermined instruction provided by the user to said processor for execution thereby;

during the execution by said processor of said predetermined instruction provided by the user, providing to said processor as said user selected microaddress the starting microaddress of said selected microroutine of the second plurality of microroutines; and executing said user selected microroutine with the micromachine only if, in response to the execution by the processor of said instruction provided by the user, the processor receives the starting microaddress of said selected microroutine as said user selected microaddress.

2. The method for direct entry into microcode of the data processor of claim 1 further comprising the step of: using results of the microroutine of the second plurality executed by the micromachine to subsequently test the functionality of a selected portion of the circuitry of the data processor.

3. The method for direct entry into microcode of the data processor of claim 2 further comprising the step of: using results of the microroutine executed by the micromachine to provide an output signal indicative of the results of said test.

* * * * *